United States Patent [19]

Dubois et al.

[11] 4,036,777

[45] July 19, 1977

[54] ION CURRENT MEASURING ARRANGEMENT

[75] Inventors: Jean Claude Dubois; Jean Jacques Le Goux, both of Courbevoie, France

[73] Assignee: Compagnie d'Applications Mecaniques a l'Electronique au Cinema et a l'Atomistique (C.A.M.E.C.A.), Courbevoie, France

[21] Appl. No.: 707,067

[22] Filed: July 20, 1976

[30] Foreign Application Priority Data

July 25, 1975 France ................................ 75.23338

[51] Int. Cl.$^2$ ........................ H01J 37/26; H01J 39/36; G01N 27/62

[52] U.S. Cl. ...................................... 250/299; 250/397

[58] Field of Search ................ 250/299, 281, 396, 397

[56] References Cited

U.S. PATENT DOCUMENTS 3,845,304 10/1974 Tamura et al. ...................... 250/397

*Primary Examiner*—Archie R. Borchelt
*Assistant Examiner*—T. N. Grigsby
*Attorney, Agent, or Firm*—Cushman, Darby & Cushman

[57] ABSTRACT

This measuring arrangement minimizes the influence of disuniformities in the first dynode, struck by the beam's ions, of the electron multiplier used in the arrangement. The beam F whose current is to be measured is expanded, for example using a divergent lens, between the analyzer slot and said dynode. In a variant embodiment, the beam is imparted a rapid oscillatory motion which causes it to scan the dynode.

3 Claims, 3 Drawing Figures

ION CURRENT MEASURING ARRANGEMENT

The present invention relates to an improvement in devices for measuring ion currents in mass spectrometry, comprising a diaphragm with analyser slot which makes it possible to separate the various ion beams as a function of the mass/charge ratio of the ions, an electron-multiplier whose first dynode is arranged in order to receive the ions of a beam transmitted by the analyser slot, and a device for measuring the current supplied by the multiplier.

A device of this kind is used in particular or the isotope analysis of a substance.

It can be used in two different ways:

For one, each beam may be presented in front of the slot for a time interval T in the course of which, using methods of integration, the current delivered by the electron-mutiplier is measured. The difficulty here is in achieving accurately defined and reproducible positioning, during said time interval, from one measurement to the next.

Indeed, any shift in the position of the beam is translated into terms of a corresponding shift in the zone of impact on the surface of the first dynode, this surface never being perfectly uniform.

Another method is to arrange for the beam on which measurement is being carried out, to move very slowly in front of the slot.

Theoretically, in this way a trapezoidal signal is obtained for the passage of each beam, the small base of the trapezium corresponding to the time interval T during which the whole of the beam is transmitted by the slot, and its height being proportional to the intensity of the ion current. It is then a straightforward matter to obtain good reproducibility in the measurement conditions. For the purposes of measurement, the small base should not be too short and this is tantamount to saying that the analyser slot should be wider than the beam (although its width is limited by the need to isolate ion beam on which measurement is being carried out, from beams corresponding to ions of adjacent mass).

Here again, however, uniformity defects at the surface of the first dynode come into play, and these are translated into terms of a "modulation" of the "small base" of the trapezum, i.e., the height of the trapezum is not accurately defined.

This means that as far as the result of measurement is concerned, a inaccuracy arises which may reach several percent.

The object of this invention is to overcome this drawback and the problem dealt with to this end is that of rendering the consequences of disuniformities in the first dynode negligible.

According to the invention, there is provided a mass spectrometry ion current measuring arrangement comprising: a diaphragm having a slot for momentarily letting through an ion beam; an electron mutiplier having a first dynode located behind said slot; a measuring device for measuring the current supplied by said mutiplier; and means for acting on said beam after it has passed through said slot and before it reaches said dynode so to expand, at least in the direction parallel to the width of said slot, the zone of said dynode struck by the ions of said beam in the course of at least each of one successive time intevals of duration Δt included in the time interval T during which the whole of said beam passes though said slot.

The invention will be better understood and other of its features rendered apparent from a consideration of the ensuing description and the related drawings in which.

Figure 1:
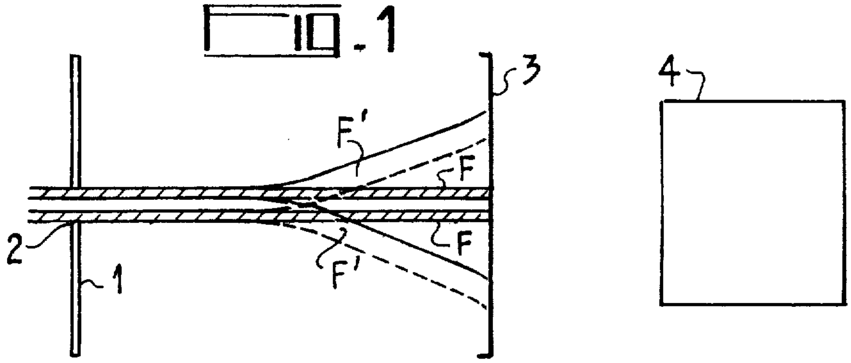
FIG. 1 is a schematic drawing illustrating the principle of he invention.

In FIG. 1 a cross-hatched illustration has been given of a beam F of ions having a given mass/charge ratio, coming from the separator device of a mass spectrometer, the beam having been shown in the two extreme positions in which it passes wholly through the slot.

A diaphragm 1 contains a slot 2 which is aligned and has its width dimensioned so as to isolate an ion beam of given mass/charge ratio from the ion beams of adjacent mass/charge ratio.

Subject to the above condition, the slot, at least if measurement is performed by moving the beam in front of the slot, is made sufficiently wide for the time of passage T (of the order 5 seconds for example) of the whole of the beam through the slot, not to be too short.

Beyond the diagragm, an electron-mutipler has been shown only the first dynode 3 of which is visible, the other elements of the multiplier and device measuring the current delivered by the last dynode, being symbolised by a rectangle 4.

If the beam F moves in front of the slot under the control of a magnetic deflector device which has not been shown, the zone of impact of the beam on the first dynode will vary substantially during the course of the time T. It is sufficient for the analyser slot to have a width twice that of the beam in order for said zones to be totally separate in relation to the first or last instants of a time interval T.

If we assume that the beam remains fixed during measurement then it will be seen that the fixed zone of impact may readily vary from one measurement to another.

In the Figure, the beam F' resulting from the widening of the beam F has also been shown, said beam F' having been shown respectively in full line and in broken line for the two illustrated positions of the beam F, the difference between the two extreme zones of impact corresponding to one and the same measurement or between the two fixed zones of impact pertaining to two measurements, becoming very small which makes it possible to render negligible the influence of disuniformities at the surface of the first dynode, upon the results of the current measurement.

Figure 2:
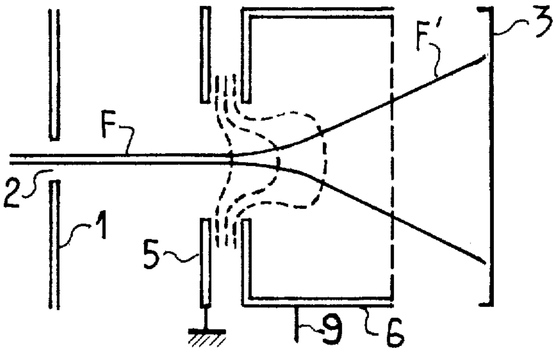
FIGS. 2 and 3 illustrate two embodiments of the invention.
Figure 3:
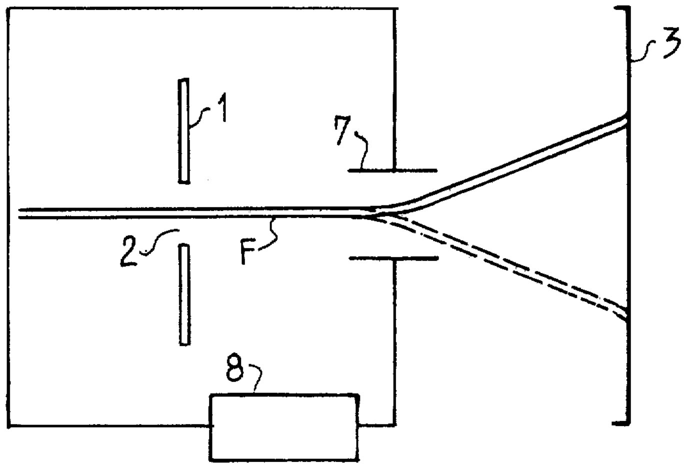

In FIGS. 2 and 3 where elements corresponding to those in FIG. 1 been designated by the same references, two embodiments of the invention have been shown by way of non limitative examples.

The first (FIG. 2), uses a divergent lens comprising an earthed electrode 5, and a cylindical electrode 6 brought to high potential through the connection 9, the polarity of said potential depending upon the sign of the ion charge, said two electrodes being equipped with slots concentric with the analyser slot and wider than the latter. In order to prevent the potential on the dynode 4 from disturbing the distribution of the lines of equal potential (shown in broken line) in the cylindrical electrode, the latter is terminated in a grid. Here, the beam F has been shown in a single, central position, this embodiment being more particularly adapted for the case where the beam remains so during the measurement time interval.

The embodiment of FIG. 3 is convenient wheter the beam remains fixed or moves slowly normally to the slot during this measurement time interval.

In FIG. 3, the widening of the zone of impact of the beam during a time interval Δt which is short compared with T, is achieved by oscillatory sweeping of the output beam from the slot, parallel to the slot width. To this end, conveniently a pair of deflector plates 7 parallel to the slot will be used, these two plates being subjected to an alternating potential difference of triangular waveform which for a time T of the order of 5 seconds may have a frequency of 10 Kc/s and is supplied by the device 8. It should be pointed out that this second embodiment makes it possible to employ deflection voltages which are small in relation to the high voltage which must to be applied to a lens. In FIG. 3, there have been shown respectively in full line and broken line, the two extreme positions of the beam F as deflected by the plates 7, this for one and the same position of the beam prior to said deflection.

What is claimed, is:

1. A mass spectrometry ion current measuring arrangement comprising: a diaphragm having a slot for momentarily letting through an ion beam; an electron multiplier having a first dynode located behind said slot; a measuring device for measuring the current supplied by said mutiplier; and means for acting on said beam after it has passed through said slot and before it reaches said dynode so as to expand, at least in the direction parallel to the width of said slot, the zone of said dynode struck by the ions of said beam in the course of at least each one of successive time intervals of duration Δt included in the time interval T during which the whole of said beam passes though said slot.

2. A measuring arrangement as claimed in claim 1, wherein said means are a divergent lens, comprising electrodes, arranged between the analyser slot and the first dynode of the mutiplier, the last electrode of the lens being terminated by a grid.

3. A measuring arrangement as claimed in claim 1, wherein said means comprise a pair of electrostatic deflector plates arranged between the analyser slot and the first dynode of the mutiplier, and means for supplying said pair of plates with an alternating potential difference of periodicity Δt/2 which is small compared with T.

* * * * *